(12) United States Patent
Lee

(10) Patent No.: US 10,535,720 B2
(45) Date of Patent: Jan. 14, 2020

(54) ORGANIC LIGHT EMITTING DIODE LIGHTING DEVICE

(71) Applicant: LG DISPLAY CO., LTD., Seoul (KR)

(72) Inventor: Jungeun Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/165,160

(22) Filed: Oct. 19, 2018

(65) Prior Publication Data

US 2019/0165057 A1    May 30, 2019

(30) Foreign Application Priority Data

Nov. 29, 2017    (KR) .................. 10-2017-0162252

(51) Int. Cl.
*H01L 27/32* (2006.01)
*H01L 51/52* (2006.01)

(52) U.S. Cl.
CPC ...... *H01L 27/3232* (2013.01); *H01L 27/3225* (2013.01); *H01L 27/3237* (2013.01); *H01L 27/3251* (2013.01); *H01L 27/3258* (2013.01); *H01L 51/5253* (2013.01); *H01L 51/5262* (2013.01)

(58) Field of Classification Search
None
See application file for complete search history.

(56) References Cited

U.S. PATENT DOCUMENTS 8,946,712 B2 * 2/2015 Yang ................. G02F 1/136209
257/390
9,482,885 B2 * 11/2016 Joo ....................... G02F 1/0102

FOREIGN PATENT DOCUMENTS

| KR | 20030001424 A | 1/2003 |
|----|---------------|--------|
| KR | 20100064214 A | 6/2010 |
| KR | 20160070241 A | 6/2016 |

\* cited by examiner

*Primary Examiner* — Minh Loan Tran
(74) *Attorney, Agent, or Firm* — Polsinelli PC

(57) ABSTRACT

Disclosed herein is an organic light emitting diode (OLED) lighting device capable of expressing characters or drawings with various colors. The OLED lighting device according to aspects of the present disclosure includes a thermochromic pattern arranged inside or outside of a substrate, the thermo chromic pattern having a property of changing a color thereof according to a change in temperature. By applying a reversible thermochromic pattern, which may maintain or lose an original color thereof according to a temperature change, to the inside or outside of the substrate, it is possible to express characters and drawings with various colors without designing a processing pattern inside the substrate.

20 Claims, 12 Drawing Sheets

300

ORGANIC LIGHT EMITTING DIODE LIGHTING DEVICE

CROSS REFERENCE TO RELATED APPLICATION

This application claims priority under 35 U.S.C. § 119 to Korean Application No. 10-2017-0162252, filed on Nov. 29, 2017, which is hereby incorporated by reference in its entirety.

BACKGROUND

Field of the Disclosure

The present disclosure relates to an organic light emitting diode (OLED) lighting device, and more particularly, to an OLED lighting device capable of expressing characters or drawings with various colors.

Description of the Background

Currently, a fluorescent lamp or an incandescent lamp is mainly used as a current lighting device. In the case of the incandescent lamp, a color rendering index is high, but energy efficiency is very low. Conversely, in the case of the fluorescent lamp, the energy efficiency is high, but the color rendering index is low. Further, the fluorescent lamp contains mercury, which causes environmental problems.

Recently, a light emitting diode (LED) based lighting device has been proposed. The LED, which is made of an inorganic light emitting material, has the highest light emission efficiency at a blue wavelength band and decreasing light emission efficiency toward a red wavelength band and a green wavelength band which has the highest luminosity factor. Thus, when the lighting device emits white light output by a combination of a red LED, a green LED and a blue LED, the light emission efficiency is lowered. Also, when using the red, green and blue LEDs, each emission peak has a narrow width, so that a color rendering property deteriorates.

In order to solve these problems, a lighting device to output white light by combining the blue LED and a yellow phosphor instead of combining the red, green and blue LEDs has been proposed, because it is more efficient to use the blue LED having higher light emission efficiency than the green LED, and for the other colors to use a fluorescent material that receives blue light to emit yellow light.

However, even though the lighting device outputs white light by combining the blue LED and a phosphor having a yellow color, the fluorescent material itself emitting yellow light has poor light emission efficiency, and thus there is a limitation in improving the light emission efficiency of the lighting device.

In order to solve the problem of a decrease in the light emission efficiency, an OLED lighting device using an OLED made of an organic light emitting material has been proposed. In general, green and red colors of the OLED each have relatively higher light emission efficiency than those of an inorganic light emitting diode. Further, blue, green and red colors of the OLED each have a relatively wider emission peak than those of the inorganic light emitting diode, and thus the OLED has an improved color rendering property. As a result, light produced from the lighting device including the OLED is more similar to sunlight.

SUMMARY

The present disclosure is to provide an organic light emitting diode (OLED) lighting device capable of expressing characters and drawings with various colors.

For this purpose, the OLED lighting device according to aspects of the present disclosure includes a thermochromic pattern arranged inside or outside of a substrate, the thermochromic having a property of changing a color thereof according to a change in temperature.

By applying a reversible thermochromic pattern, which may maintain or lose an original color according to a temperature change, to the inside or outside of the substrate, it is possible to express characters and drawings with various colors without designing a processing pattern inside the substrate.

The OLED lighting device according to aspects of the present disclosure may include a reversible or irreversible thermochromic pattern, which returns or does not return to an original color according to a temperature change, to the inside or the outside of the substrate. Accordingly, it is possible to express characters and drawings with various colors without designing a processing pattern inside the substrate.

The thermochromic pattern arranged in an active area of a second surface of the substrate may allow light emitted from an organic light emitting layer when the OLED lighting device is driven to pass through only a portion where the thermochromic pattern is not arranged. Further, the thermochromic pattern, which is discolored by heat generated when the OLED lighting device is driven, may make it possible to express characters or drawings with various colors.

Furthermore, the thermochromic pattern arranged to cover an entire non-active area of the substrate may make the non-active area seem to emit light having substantially the same color as the active area. Therefore, the OLED lighting device may exhibit substantially the same effect as a bezel-less structure in which light is emitted in an active area and the non-active area.

The OLED lighting device according to aspects of the present disclosure may include a reversible or irreversible thermochromic pattern, which returns or does not return to an original color according to a temperature change, to the inside or the outside of the substrate. Accordingly, it is possible to express characters and drawings with various colors without designing a processing pattern inside the substrate.

The thermochromic pattern arranged in an active area of a second surface of the substrate may allow light emitted from an organic light emitting layer when the OLED lighting device is driven to pass through only a portion where the thermochromic pattern is not arranged. Further, the thermochromic pattern, which is discolored by heat generated when the OLED lighting device is driven, may make it possible to express characters or drawings with various colors.

Furthermore, the thermochromic pattern arranged to cover an entire non-active area of the substrate may make the non-active area seem to emit light having substantially the same color as the active area. Therefore, the OLED lighting device may exhibit substantially the same effect as a bezel-less structure in which light is emitted in an active area and the non-active area.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
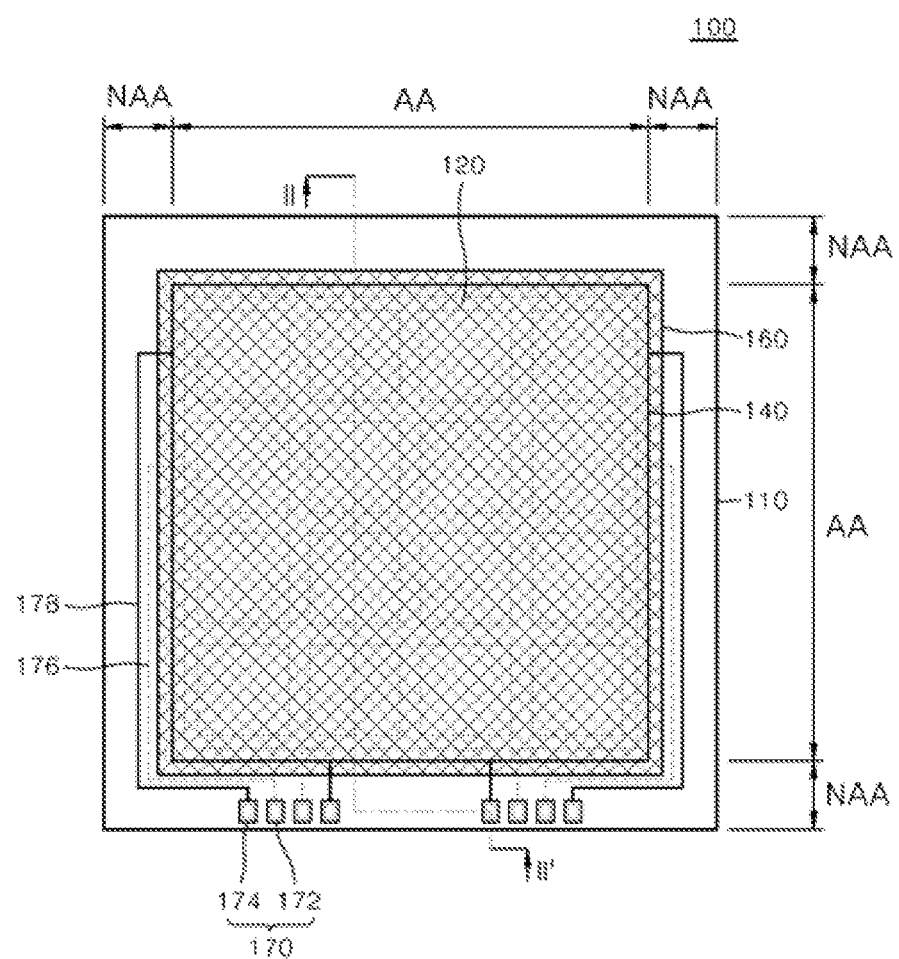
FIG. 1 is a plan view showing an OLED lighting device according to a first aspect of the present disclosure.

The aforementioned objects, features and advantages will be described in detail with reference to the accompanying drawings, such that those skilled in the art can easily carry out a technical idea of the present disclosure. In the description of the aspects, the detailed description of well-known related configurations or functions will be omitted when it is deemed that such description will cause ambiguous interpretation of the present disclosure. Hereinafter, aspects of the present disclosure will be described in detail with reference to the accompanying drawings. In the drawings, same reference numerals designate same or like elements.

Hereinafter, an organic light emitting diode (OLED) lighting device according to aspects of the present disclosure will be described in detail with reference to the accompanying drawings.

Figure 2:
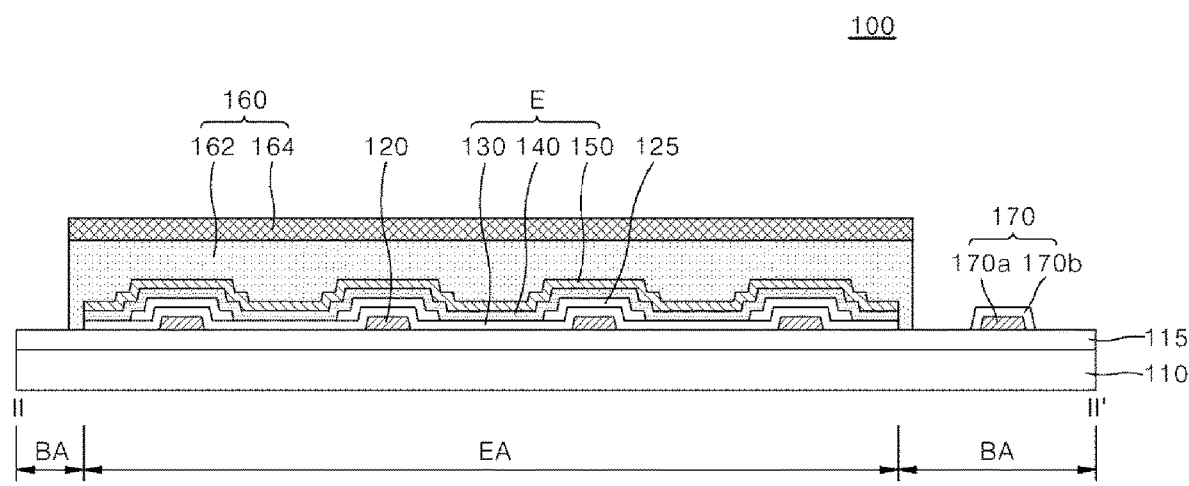
FIG. 2 is a cross-sectional view taken along line II-II' of FIG. 1.

FIG. 1 is a plan view showing an OLED lighting device according to a first aspect of the present disclosure. FIG. 2 is a cross-sectional view taken along line II-II' of FIG. 1.

Referring to FIGS. 1 and 2, an OLED display device 100 according to the first aspect may include a substrate 110, a buffer layer 115 arranged on the substrate 110 and an OLED E arranged on the buffer layer 115.

The OLED E may include a first electrode 130 arranged on the buffer layer 115, an organic light emitting layer 140 stacked on the first electrode 130, and a second electrode 150 stacked on the organic light emitting layer 140.

The organic light emitting layer 140 may emit light in line with a signal being applied to the first electrode 130 and the second electrode of the OLED E, and thereby the OLED lighting device 100 may output light over the entire substrate 110.

Here, an auxiliary electrode 120 may be arranged in a matrix shape on the substrate 110.

The auxiliary electrode 120 may be made of a metal material having high conductivity so that a uniform voltage is applied to the first electrode 130 arranged over an entire active area AA of the substrate 110, and thereby it is possible for the large-area OLED lighting device 100 to emit light with uniform luminance. The auxiliary wiring 120 may be arranged between the buffer layer 115 and the first electrode 130 to be connected to the first electrode 130 in direct contact therewith.

The first electrode 130 made of a transparent conductive material such as indium tin oxide (ITO) may transmit the emitted light, but may have higher electrical resistance than the metal material. Therefore, when the large-area lighting device 100 is manufactured, current applied to the wide active area AA may be dispersed non-uniformly by the high resistance of the transparent conductive material. Such non-uniform current dispersion makes it impossible for the large-area OLED lighting device 100 to emit light with uniform luminance.

The auxiliary wiring 120 may be arranged in a matrix shape, a mesh shape, a hexagonal shape, an octagonal shape, a circular shape, or the like with a narrow width over the entire substrate 110 so that a uniform voltage is applied to the first electrode 130 arranged over the entire substrate 110, and thereby it is possible for the large-area OLED lighting device 100 to emit light with uniform luminance.

Here, the auxiliary wiring 120 may be arranged under the first electrode 130, but may be arranged on the first electrode 130. The auxiliary wiring 120 may be formed of at least one of Al, Au, Cu, Ti, W, Mo, and Cr. The auxiliary electrode 120 may have a single-layered structure, or a multi-layered structure including at least two layers.

The auxiliary wiring 120 may be arranged in a matrix shape to partition the substrate 110 into a plurality of pixels. In other words, the auxiliary wiring 120 may have much lower resistance than the first electrode 130, and thus, the voltage of the first electrode 130 may not be directly applied to the first electrode 130 through a first pad 172 but may be applied thereto through the auxiliary wiring 120. Therefore, although the first electrode 130 is formed over the entire substrate 110, the first electrode 130 may be partitioned into the plurality of pixels by the auxiliary wiring 120. The auxiliary wiring 120 may have a width of about 30 to 70 micrometers (μm), but this width value is merely an example. The width of the auxiliary wiring 120 may be varied according to various factors such as a type of the metal used, an area of the OLED lighting device 100, a size of the pixel, and the like.

Also, a pad 170, which is connected to each of the first electrode 130 and the second electrode 150 to receive a voltage from the outside, may be arranged on the substrate 110. Here, the pad 170 may be provided with a first pad 172 connected to the first electrode 130 and a second pad 174 connected to the second electrode 150. The first pad 172 and the second pad 174 may be electrically connected to the first electrode 130 and the second electrode 150 through a first connection wiring 176 and a second connection wiring 178, respectively.

Although FIG. 1 illustrates that the pad 170 is arranged in a non-active area (NAA) of an edge of one side of the substrate 110, this configuration is merely an example. The position and number of the pad 170 may be configured in various forms. That is, the pad 170 may be arranged in each of the non-active areas NAA of edges of opposite sides of the substrate 110, or may be arranged in each of the non-active areas NAA of edges of four sides of the substrate 110.

Here, the pad 170 may be arranged on the same layer as the auxiliary wiring 120, and may be provided with a pad electrode 170a made of the same material as the auxiliary wiring 120 and a pad electrode terminal 170b made of the same material as the first electrode 130.

A protective layer 125 may be stacked on the first electrode 130. The protective layer 125 may be arranged on the first electrode 130 to cover the auxiliary wiring 120.

Since the auxiliary wiring 120 is made of an opaque metal, no light is output to an area where the auxiliary wiring 120 is formed. Therefore, the protective layer 1125 may be arranged only on the first electrode 130 on which the auxiliary wiring 120 is arranged, and may not be arranged on the first electrode where the auxiliary wiring 120 is not arranged, so that light is emitted only in a light emitting area of the pixel.

Also, the protective layer 125 may be formed to surround the auxiliary wiring 120 so as to reduce a step coverage caused by the auxiliary wiring 120, so that the organic light emitting layer 140 and the second electrode 150 to be stacked thereafter may be stably stacked without being disconnected.

For this purpose, the protective layer 125 may be composed of an inorganic layer such as SiOx or SiNx. Alternatively, the protective layer 125 may be composed of an organic layer such as photo-acryl, or a plurality of layers including an inorganic layer and an organic layer.

The organic light emitting layer 140 and the second electrode 150 may be arranged on the first electrode 130 and the protective layer 125 in a sequential order.

The organic light emitting layer 140 may be made of an organic light emitting material that outputs white light. For example, the organic light emitting layer 140 may include a blue organic light emitting layer, a red organic light emitting layer, and a green organic light emitting layer. Alternatively, the organic light emitting layer 140 may have a tandem structure including a blue light emitting layer and a yellow-green light emitting layer. However, the organic light emitting layer 140 according to aspects is not limited to the aforementioned structures, but may have various structures.

Also, although not shown in the drawings, the OLED E may further include an electron injecting layer and a hole injecting layer to respectively inject electrons and holes; an electron transporting layer and a hole transporting layer to respectively transport the injected electrons and holes; and a charge generating layer to generate charges such as the electrons and the holes.

The organic light emitting layer 140 may be made of a material that emits light in a visible light area by receiving holes and electrons from the hole transporting layer and the electron transporting layer, respectively and combining them. Here, an organic material having high quantum efficiency for fluorescence or phosphorescence may be used.

The organic material may include, for example, a 8-hydroxy-quinoline aluminum complex ($Alq_3$), a carbazole-based compound, a dimerized styryl compound, a bis-methyl-8-hydroxyquinoline paraphenylphenol aluminum complex (Balq), a 10-hydroxybenzoquinoline-metal compound, benzoxazole, benzthiazole and benzimidazole-based compounds, an anthracene-based compound, a pyrene-based compound, a poly(p-phenylenevinylene) (PPV)-based polymer, a spiro compound, polyfluorene, and lubrene, but is not limited thereto.

The second electrode 150 may be formed of metal such as Ca, Ba, Mg, Al, and Ag, or an alloy thereof. Here, the second pad 174 connected to the second electrode 150 to apply a voltage to the second electrode 150 may be provided in the non-active region NAA of the substrate 110.

The first electrode 130, the organic light emitting layer 140, and the second electrode 150 may constitute the OLED E. Here, when a voltage is applied to the first electrode 130 which is an anode of the OLED E and the second electrode 150 which is a cathode of the OLED E, an electron and a hole may be respectively injected from the second electrode 150 and the first electrode 130 into the organic light emitting layer 140 to generate an exciton in the organic light emitting layer 140. As the exciton decays, light corresponding to an energy difference between a lowest unoccupied molecular orbital (LUMO) and a highest occupied molecular orbital (HOMO) of the organic light emitting layer 140 may be generated and emitted in a direction toward the substrate 110.

An encapsulating layer 160 that covers the second electrode 150 of the OLED E may be stacked in the active area AA of the substrate 110 provided with the OLED E. Here, the encapsulating layer 160 may be arranged to cover a first surface of the substrate on which the OLED E is arranged, so that the encapsulating layer 160 may seal the OLED E in such a manner as to wrap top and side surfaces of the OLED E.

The encapsulation layer 160 may include an adhesive layer 162 and a base layer 164 arranged on the adhesive layer 162. The encapsulating layer 160 including the adhesive layer 162 and base layer 164 may be arranged in the active area AA of the substrate provided with the OLED E, and the base layer 164 may be adhered to the OLED E by the adhesive layer 162, and thereby it is possible to seal the OLED lighting device 100.

Here, a photocurable adhesive or a thermosetting adhesive may be used as the adhesive layer 162. The base layer 164 arranged to prevent moisture or air from permeating from the outside may be made of any material as long as it is able to perform a function of preventing permeation of moisture or air. For example, the base layer 164 may be made of a polymer material such as polyethyleneterephtalate (PET), or a metal material such as an aluminum foil, a Fe—Ni alloy, a Fe—Ni—Co alloy, or the like.

The aforementioned OLED lighting device 100 according to the first aspect uses the OLED E made of an organic light emitting material, and thus green and red colors of the OLED lighting device 100 each may have higher light emission efficiency than those of the lighting device that uses an inorganic light emitting diode. Further, blue, green and red colors of the OLED lighting device 100 each have a relatively wider emission peak than those of the lighting device that uses the inorganic light emitting diode, and thus the OLED lighting device 100 has an improved color rendering property. As a result, light emitted from the OLED lighting device 100 including the OLED E may be more similar to sunlight.

But, since the OLED lighting device 100 according to the first aspect is limited to a surface light emitting device that uses the OLED E, it is difficult to implement various colors, forms and functions.

In order to solve this problem, the OLED lighting device according to the second aspect may express characters or drawings by designing a processing pattern inside the substrate.

Figure 3:
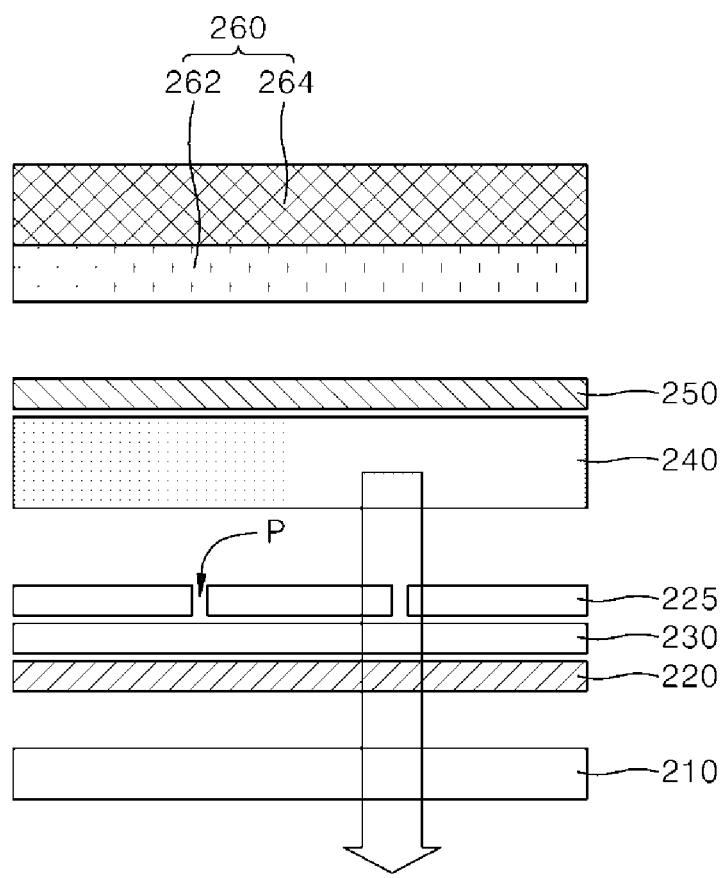
FIG. 3 is a mimetic diagram showing an OLED lighting device according to a second aspect of the present disclosure.

FIG. 3 is a mimetic diagram showing an OLED lighting device according to the second aspect. Here, the OLED lighting device according to the second aspect has substantially the same configuration as the OLED lighting device according to the first aspect, except that the processing pattern is designed inside the substrate. Therefore, no detailed description of the same configuration will be provided.

As shown in FIG. 3, an OLED lighting device 200 according to the second aspect may include a processing pattern P designed inside a substrate 210. Here, although FIG. 3 illustrates an example in which the processing pattern P utilizes a portion of the protective layer 225 of the substrate 210. Although not shown in the drawings, the processing pattern P may utilize portions of the auxiliary wiring 220 and the first electrode 230 of the substrate 210.

When a portion of a protective layer 225 is utilized as the processing pattern P, the portion of the protective layer 225 may be selectively etched such that it is patterned to have a desired character or drawing.

Accordingly, the processing pattern P provided on the protective layer 225 may allow light emitted from an organic light emitting layer 240 to be emitted toward the substrate 210, and thereby it is possible to express characters or drawings of the processing pattern P.

A portion where the processing pattern P designed inside the substrate 210 is arranged may be defined as a non-light emitting area through which light does not pass, and thus there is a problem that extraction efficiency of light emitted from the organic light emitting layer 240 is deteriorated.

Also, since the OLED lighting device 200 according to the second aspect has a structure in which the processing pattern P is designed inside the substrate 210, there is a limitation that only white light of surface lights emitted from the organic light emitting layer 240 may be applied. Thus, it is not possible to implement various colors.

In order to solve this problem, the OLED lighting device according to the third aspect may include a thermochromic pattern which is discolored by heat generated when the OLED lighting device is driven, and the thermochromic pattern may be applied to the outside of a substrate.

As a result, the thermochromic pattern arranged outside the substrate may make it possible to express characters or drawings with various colors without designing a processing pattern inside the substrate.

This configuration will be described in more detail with reference to the accompanying drawings.

Figure 4:
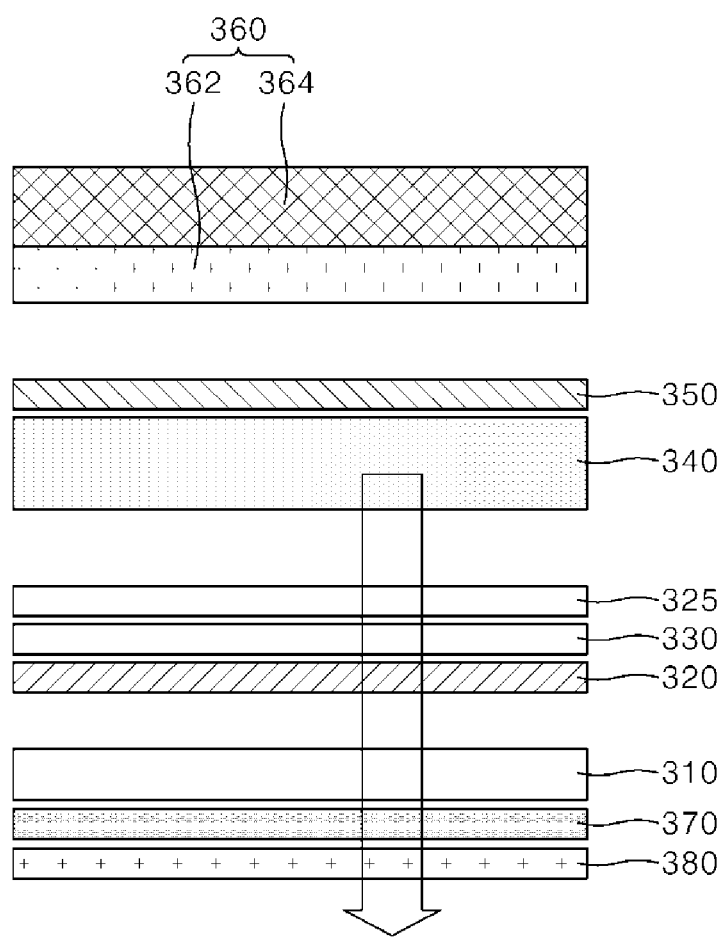
FIG. 4 is a mimetic diagram showing an OLED lighting device according to a third aspect of the present disclosure.
Figure 5:
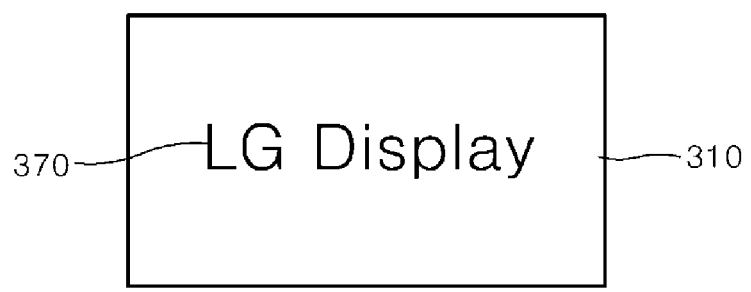
FIG. 5 is a schematic plan view showing an OLED lighting device according to the third aspect of the present disclosure.

FIG. 4 is a mimetic diagram showing an OLED lighting device according to the third aspect, and FIG. 5 is a schematic plan view showing an OLED lighting device according to the third aspect.

Referring to FIGS. 4 and 5, an OLED lighting device 300 according to the third aspect may include a substrate 310, an auxiliary wiring 320, a first electrode 330, an organic light emitting layer 340, a second electrode 350, and a thermochromic pattern 370.

The substrate 310 may be made of a transparent glass material. Alternatively, the substrate 310 may be made of a polymer material having a flexible property. Although not shown in the drawings, a buffer layer (shown as 115 of FIG. 2) may be further arranged on a front surface of the substrate 310. The buffer layer serves to block moisture and air permeating from a bottom of the substrate 310. For this purpose, the buffer layer may be composed of an inorganic layer such as SiOx and SiNx The auxiliary wiring 320 may be arranged on a first surface of the substrate 310. The auxiliary wiring 320 may be formed of a metal material having excellent conductivity, so that a uniform voltage may be applied to the first electrode 330 arranged over the entire area of the substrate 310. Accordingly, it is possible for the large-area OLED lighting device 100 to emit light with uniform luminance. The auxiliary wiring 320 may be arranged between the substrate 310 and the first electrode 330 to be connected to the first electrode 330 in direct contact therewith.

The first electrode 330 made of a transparent conductive material such as ITO may transmit the emitted light, but may have higher electrical resistance than a metal material.

Therefore, when the large-area OLED lighting device 300 is manufactured, the current applied to a wide active area may be dispersed non-uniformly by the high resistance of the transparent conductive material. Such non-uniform current dispersion makes it impossible for the large-area OLED lighting device 100 to emit light with uniform luminance.

The auxiliary electrode 320 may be arranged in a matrix shape, a mesh shape, a hexagonal shape, an octagonal shape, a circular shape, or the like with a narrow width over the entire substrate 310 so that a uniform voltage is applied to the first electrode 330 arranged over the entire substrate 310, and thereby it is possible for the large-area OLED lighting device 300 to emit light with uniform luminance.

Here, the auxiliary electrode 320 is arranged under the first electrode 330, but may be also arranged on the first electrode 330. The auxiliary electrode 320 may be formed of format least one of Al, Au, Cu, Ti, W, Mo, and Cr. The auxiliary electrode 320 may have a single-layered structure, or a multi-layered structure including at least two layers.

The auxiliary wiring 320 may be arranged in a matrix shape to partition the substrate 310 into a plurality of pixels. In other words, the auxiliary wiring 320 may have much lower resistance than the first electrode 330, and thus, the voltage of the first electrode 330 may not be directly applied to the first electrode 330 through the first pad (shown as 172 of FIG. 1) but may be applied thereto through the auxiliary wiring 320. Therefore, although the first electrode 330 is formed over the entire substrate 310, the first electrode 330 may be partitioned into the plurality of pixels by the auxiliary wiring 320.

The auxiliary wiring 320 may have a width of about 30 to 70 μm, but this width value is merely an example. The width of the auxiliary wiring 320 may be varied according to various factors such as a type of the metal used, an area of the OLED lighting device 300, a size of the pixel, and the like.

The first electrode 330 may be connected to the auxiliary wiring 320, the organic light emitting layer 340 may be stacked on the first electrode 330, and the second electrode 350 may be stacked on the organic light emitting layer 340. Here, the OLED (shown as E of FIG. 2) may include the first electrode 330, the organic light emitting layer 340, and the second electrode 350.

Here, the first electrode 330 may be arranged on a second surface of the substrate 310 on which the auxiliary wiring 320 is arranged so that the first electrode 330 is directly electrically connected to the auxiliary wiring 320. The first electrode 330 may be formed of a transparent conductive material including one of ITO, indium zinc oxide (IZO), and indium tin zinc oxide (ITZO) to transmit the emitted light.

The organic light emitting layer 340 may be made of an organic light emitting material that outputs white light. For example, the organic light emitting layer 340 may include a blue organic light emitting layer, a red organic light emitting layer, and a green organic light emitting layer. Alternatively, the organic light emitting layer 340 may have a tandem structure including a blue light emitting layer and a yellow-green light emitting layer. However, the organic light emitting layer 340 according to aspects is not limited to the aforementioned structures, but may have various structures.

Also, although not shown in the drawings, the OLED may further include an electron injecting layer and a hole injecting layer to respectively inject electrons and holes; an electron transporting layer and a hole transporting layer to respectively transport the injected electrons and holes; and a charge generating layer to generate charges such as the electrons and the holes.

The organic light emitting layer 340 may be made of a material that emits light in a visible light area by receiving holes and electrons from the hole transporting layer and the electron transporting layer, respectively and combining them. Here, an organic material having high quantum efficiency for fluorescence or phosphorescence may be used.

The organic material may include, for example, a 8-hydroxy-quinoline aluminum complex ($Alq_3$), a carbazole-based compound, a dimerized styryl compound, a bis-methyl-8-hydroxyquinoline paraphenylphenol aluminum complex (Balq), a 10-hydroxybenzoquinoline-metal compound, benzoxazole, benzthiazole and benzimidazole-based compounds, an anthracene-based compound, a pyrene-based compound, a poly(p-phenylenevinylene) (PPV)-based polymer, a spiro compound, polyfluorene, and lubrene, but is not limited thereto.

The OLED lighting device 300 according to the third aspect may further include a protective layer 325 arranged between the first electrode 330 and the organic light emitting layer 340 to cover the auxiliary wiring 320. The protective layer 325 may be formed to surround the auxiliary wiring 320 so as to reduce a step coverage caused by the auxiliary wiring 320. Accordingly, the organic light emitting layer 340 and the second electrode 350 stacked on the protective layer 325 may be stably stacked without being disconnected.

For this purpose, the protective layer 325 may be composed of an inorganic layer such as SiOx or SiNx. Alternatively, the protective layer 325 may be composed of an organic layer such as photo-acryl, or a plurality of layers including an inorganic layer and an organic layer.

The thermochromic pattern 370 may be arranged on a back surface corresponding to the second surface of the substrate 310. The thermochromic pattern 370 may be arranged in an active area of the second surface of the substrate 310.

In particular, the thermochromic pattern 370 may include a thermochromic pigment. Here, the thermochromic pigment may have a property of changing color thereof according to a change in temperature, and a reaction temperature may vary according to a material of the thermochromic pigment.

In other words, when a temperature of the thermochromic pigment rises to a particular temperature, the color thereof begins to disappear, and when the temperature of the thermochromic pigment reaches the particular temperature, the color thereof becomes colorless and transparent. The thermochromic pigment may be classified as a reversible thermochromic pigment or an irreversible thermochromic pigment depending on whether the thermochromic pigment returns to the original color thereof when the temperature falls below the particular temperature. Accordingly, the thermochromic pattern 370 may include a reversible thermochromic pigment that returns to the original color thereof or an irreversible thermochromic pigment that remains colorless according to a change in temperature.

For example, a pigment having a property of becoming a colorless when the temperature thereof rises to an active temperature of 20 to 40° C. due to heat generated at the time the OLED lighting device 300 is driven, and returning to the original color thereof at the time the OLED lighting device 300 is stopped may be used as the thermochromic pigment.

As the thermochromic pigment, a pigment available from Carmel Chemicals Inc. may be used. In particular, the thermochromic pigment may have colors such as yellow, orange, magenta, rose red, sky blue, dark blue, fast blue, violet, Turkish blue, green, black, and the like. It is obvious that the thermochromic pigment may have various colors other than the aforementioned colors.

Accordingly, the thermochromic pattern 370 arranged in the active area of the second surface of the substrate 310 may allow light emitted from the organic light emitting layer 340 when the OLED lighting device 300 is driven to pass through only a portion where the thermochromic pattern is not arranged. Further, the thermochromic pattern, which is discolored by heat generated when the OLED lighting device is driven, may make it possible to express characters or drawings with various colors.

The thermochromic pattern 370 may further include a photosensitive material including photo-acryl. The thermochromic pattern 370 including a photosensitive material may cover the entire second surface of the substrate 310 with a thermochromic material.

Thereafter, patterning may be performed through selective exposure to light using a digital exposure device, thereby making it possible to easily implement a desired character or drawing. Accordingly, it is not necessary to etch the thermochromic material coated on the entire second surface of the substrate 310, so that using a separate etching mask is also unnecessary.

The thermochromic pattern 370 may have a thickness in micrometer, or 1 to 300 μm, so as to exhibit a micro cavity effect. When the thermochromic pattern 370 is designed to have a thickness of 1 to 300 μm, the light extraction efficiency may be improved by the micro cavity effect to minimize the influence on a light emission property of the light emitted from the organic light emitting layer 340.

Also, the OLED lighting device 300 according to the third aspect may further include a barrier layer 380 and an encapsulation layer 360.

The barrier layer 380 may cover the thermochromic pattern 370 and the second surface of the substrate 310.

The barrier layer 380 may serve to protect the thermochromic pattern 370 arranged on the second surface of the substrate 310. For this purpose, the barrier layer 380 may include at least one of polyethyleneterephthalate (PET), polymethyl methacrylate (PMMA), polyethylene terephthalate (PEN), polyester (PE), polycarbonate (PC) and polyethersulfone (PES).

The encapsulation layer 360 may cover the OLED including the first electrode 330, the organic light emitting layer 340, and the second electrode 350. Although not shown in detail in the drawings, the encapsulation layer 360 may be arranged to cover the first surface of the substrate 310 on which the OLED is arranged, so that the encapsulating layer 360 may seal the OLED in such a manner as to wrap top and side surfaces of the OLED.

The encapsulation layer 360 may include an adhesive layer 362 and a base layer 364 arranged on the adhesive layer 362. The encapsulating layer 360 including the adhesive layer 362 and base layer 364 may be arranged on the substrate 310 provided with the OLED, and the base layer 364 may be adhered to the OLED by the adhesive layer 362, and thereby it is possible to seal the OLED lighting device 300.

Here, a photocurable adhesive or a thermosetting adhesive may be used as the adhesive layer 362. The base layer 364 arranged to prevent moisture or air from permeating from the outside may be made of any material as long as it is able to perform a function of preventing permeation of moisture or air. For example, the base layer 364 may be made of a polymer material such as polyethyleneterephtalate (PET), or a metal material such as an aluminum foil, a Fe—Ni alloy, a Fe—Ni—Co alloy, or the like.

Also, the encapsulation layer 360 may further include an encapsulation insulating layer (not shown) arranged between the adhesive layer 362 and the second electrode 350 of the OLED. Here, the encapsulation insulating layer may be composed of an inorganic layer such as SiOx or SiNx. Alternatively, the encapsulation insulating layer may be composed of an organic layer such as photo-acryl, or a plurality of layers including an inorganic layer and an organic layer.

The reversible or irreversible thermochromic pattern 370 that returns or does not return to the original color thereof according to a change in temperature may be applied to the outside of the substrate 310. Accordingly, it is possible to express characters or drawings with various colors without designing a processing pattern inside the substrate.

The thermochromic pattern 370 arranged in the active area of the second surface of the substrate 310 may allow light emitted from the organic light emitting layer 340 when the OLED lighting device 300 is driven to pass through only a portion where the thermochromic pattern is not arranged. Therefore, the thermochromic pattern, which is discolored by heat generated when the OLED lighting device 300 is driven, may make it possible to express characters or drawings with various colors.

Figure 6:
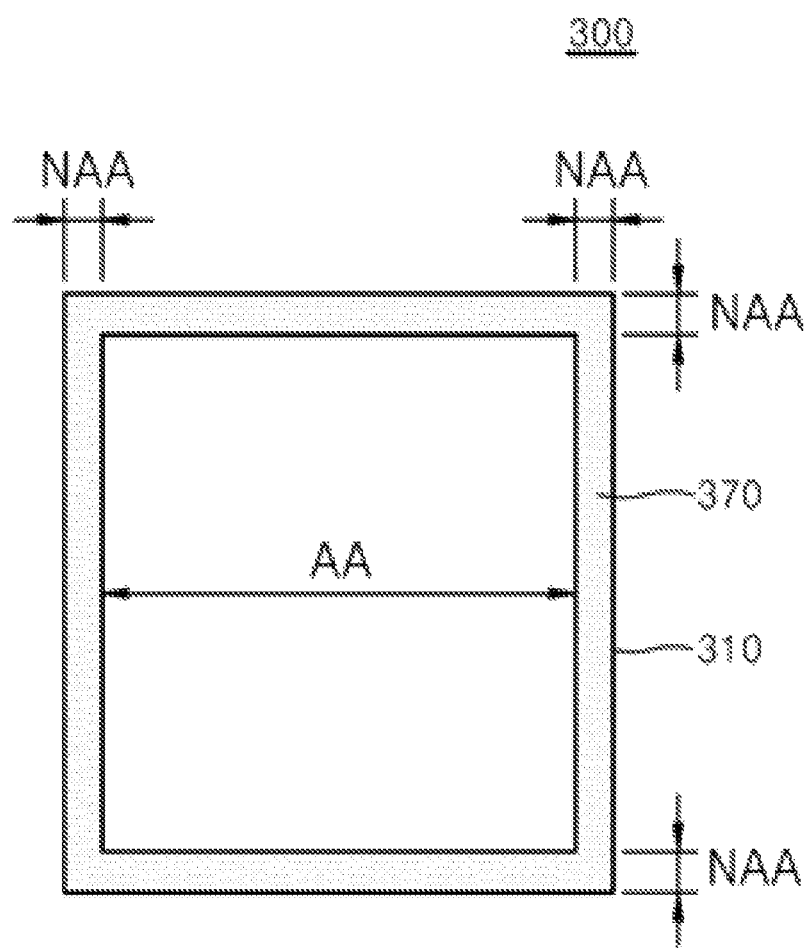
FIG. 6 is a plan view of an OLED lighting device according to a modification of the third aspect of the present disclosure.

FIG. 6 is a plan view of an OLED lighting device according to a modification of the third aspect. Here, the OLED lighting device according to the modification of the third aspect has substantially the same configuration as the OLED lighting device according to the third aspect, except a position where the thermochromic pattern is arranged. Therefore, no detailed description of the same configuration will be provided.

As shown in FIG. 6, the thermochromic pattern 370 may be arranged in a non-active area NAA. Here, the thermochromic pattern 370 may be arranged to cover the entire non-active area NAA.

The thermochromic pattern 370 arranged to cover the entire non-active area NAA of the substrate may allow to implement a bezel-less structure that makes the non-active area NAA seem to emit light having substantially the same color as the active area AA.

For this purpose, the thermochromic pattern 370 may include a thermochromic pigment having a color substantially the same as that of light emitted from the organic light emitting layer 340 of the substrate 310.

The thermochromic pattern arranged to cover the entire non-active area NAA of the substrate 310 may make the non-active area NAA seem to emit light having substantially the same color as the active area AA. Therefore, the OLED lighting device according to the modification of the third aspect may exhibit substantially the same effect as the bezel-less structure in which light is emitted in both the active area AA and the non-active area NAA.

Also, although not shown in detail in the drawings, the thermochromic pattern 370 may be arranged in each of the active area AA and the inactive area NAA. In this case, it is possible not only to implement the bezel structure but also to express characters or drawings having various colors, without designing the processing pattern inside the substrate 310.

Figure 7:
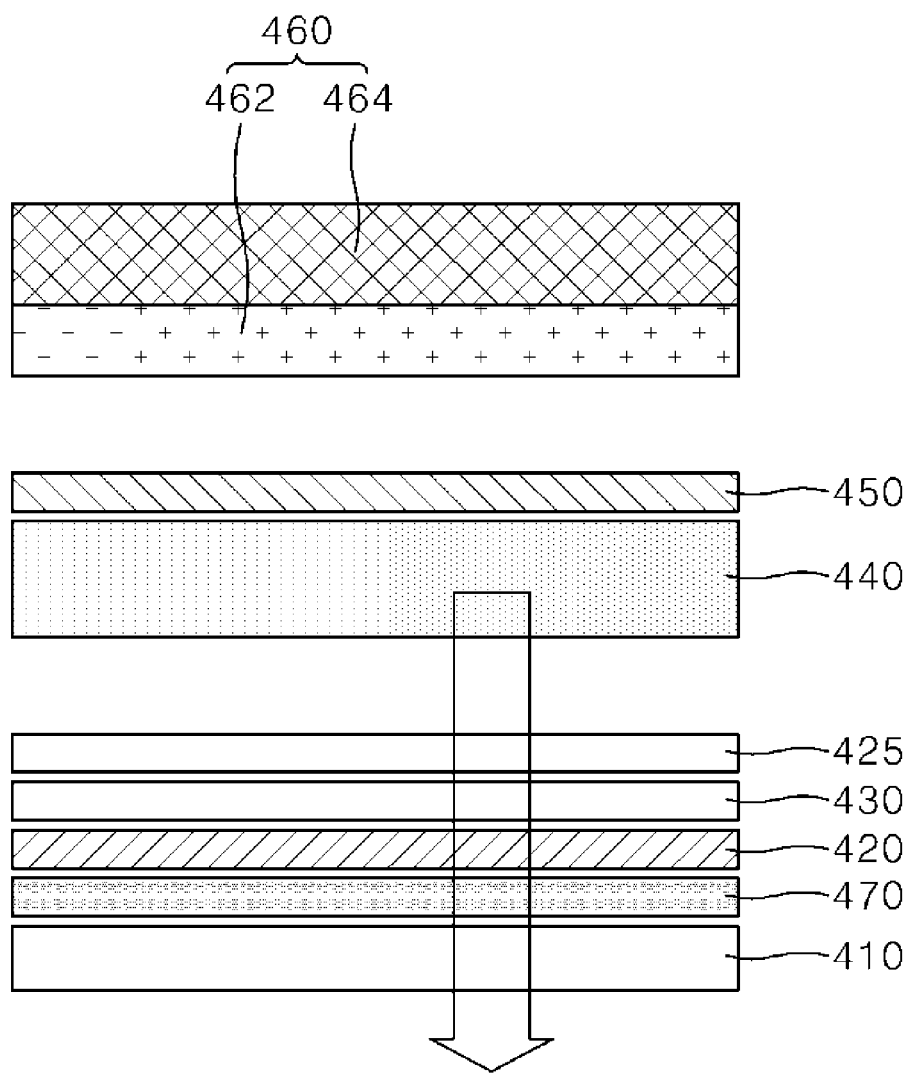
FIG. 7 is a mimetic diagram showing an OLED lighting device according to a fourth aspect of the present disclosure.
Figure 8:
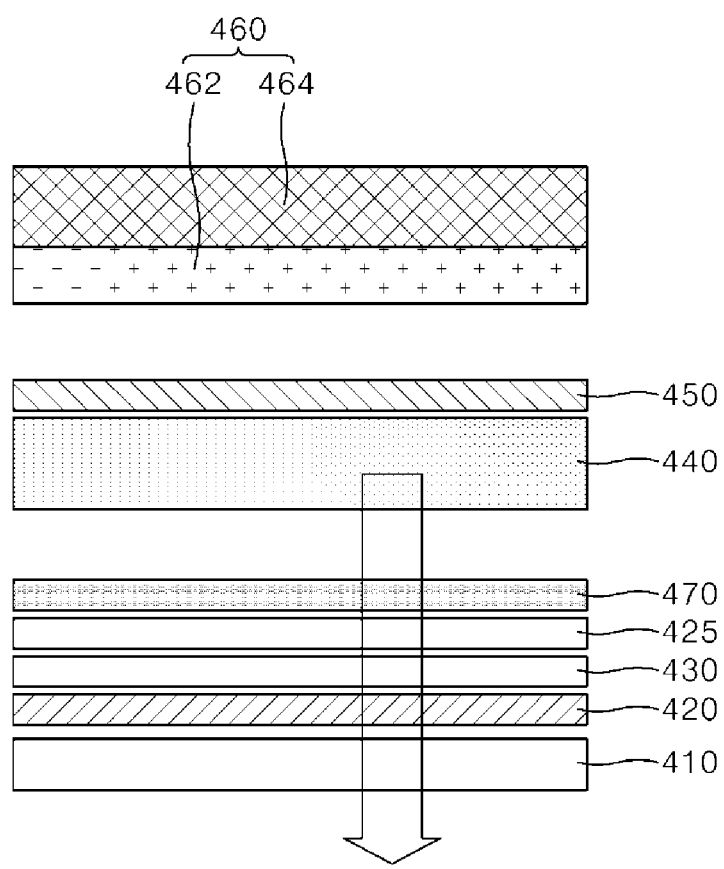
FIG. 8 is a mimetic diagram showing an OLED lighting device according to a modification of the fourth aspect.

FIG. 7 is a mimetic diagram showing an OLED lighting device according to a fourth aspect, and FIG. 8 is a mimetic diagram showing an OLED lighting device according to a modification of the fourth aspect. Here, OLED lighting devices 400 according to the fourth aspect and the modification of the fourth aspect each have substantially the same configuration as the OLED lighting device 300 according to the third aspect, except that the thermochromic pattern is arranged inside the substrate. Therefore, no detailed description of the same configuration will be provided.

As shown in FIGS. 7 and 8, the thermochromic pattern may be arranged inside the substrate.

Here, as shown in FIG. 7, a thermochromic pattern 470 may be arranged between a substrate 410 and an auxiliary wiring 420. The thermochromic pattern 470 may be arranged between the substrate 410 and the buffer layer (shown as 115 of FIG. 2).

As shown in FIG. 8, the thermochromic pattern 470 may be arranged between the buffer layer and an organic light emitting layer 440. The thermochromic pattern 470 may be arranged between the organic light emitting layer 440 and a protective layer 425.

When the thermochromic pattern 470 is arranged inside the substrate 410 according to the fourth aspect and the modification of the fourth aspect, it is possible to express characters or pictures with various colors without designing a processing pattern inside the substrate 410, as in the first aspect of the present disclosure.

Further, when the thermochromic pattern 470 is arranged inside the substrate 410 according to the fourth aspect and the modification of the fourth aspect, it is possible to stably protect the thermochromic pattern 470 without arranging the barrier layer (refer to 380 of FIG. 4) to protect the thermochromic pattern 470. Therefore, it is possible to reduce manufacturing costs because the barrier layer is removable.

Figure 9:
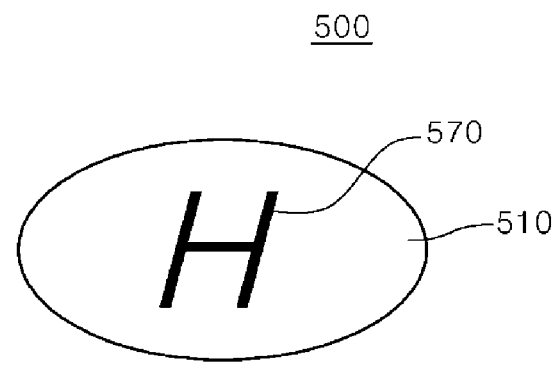
FIG. 9 is a plan view showing an OLED lighting device according to a fifth aspect of the present disclosure.
Figure 10:
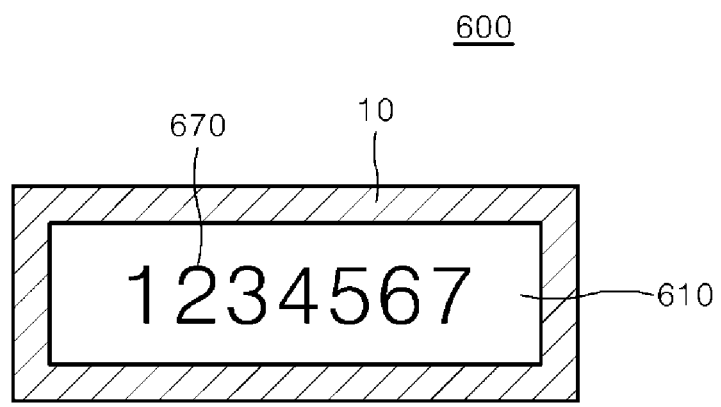
FIG. 10 is a plan view showing an OLED lighting device according to a sixth aspect of the present disclosure.

FIG. 9 is a plan view showing an OLED lighting device according to a fifth aspect, and FIG. 10 is a plan view showing an OLED lighting device according to a sixth aspect of the present disclosure.

First, as shown in FIG. 9, an OLED lighting device 500 according to the fifth aspect may be an OLED lighting device for an automobile emblem.

For this purpose, the OLED lighting device 500 may include a substrate 510 to be attached to front and rear surfaces of an automobile and a thermochromic pattern 570 arranged on the substrate 510 to display an emblem. As described above, the thermochromic pattern 570 may be arranged on a second surface of the substrate 510 or inside the substrate 510. Also, as shown in FIG. 10, an OLED lighting device 600 according to the sixth aspect may be an OLED lighting device for an automobile license plate.

For this purpose, the OLED lighting device 600 may include a substrate 610 mounted on a license plate frame 10 and a thermochromic pattern 670 arranged on the substrate 610 to display a license plate number. The respective thermochromic patterns 570 and 670 according to the fifth aspect and the sixth aspect may be substantially the same as the thermochromic pattern according to the third aspect described with reference to FIG. 4.

As in the fifth and sixth aspects, the OLED lighting device may be used for the automobile emblem or automobile license plate. Also, although not shown in the drawings, the OLED lighting device may be used for a safety signal lamp, a wall paper for advertisements, and the like.

Figure 11:
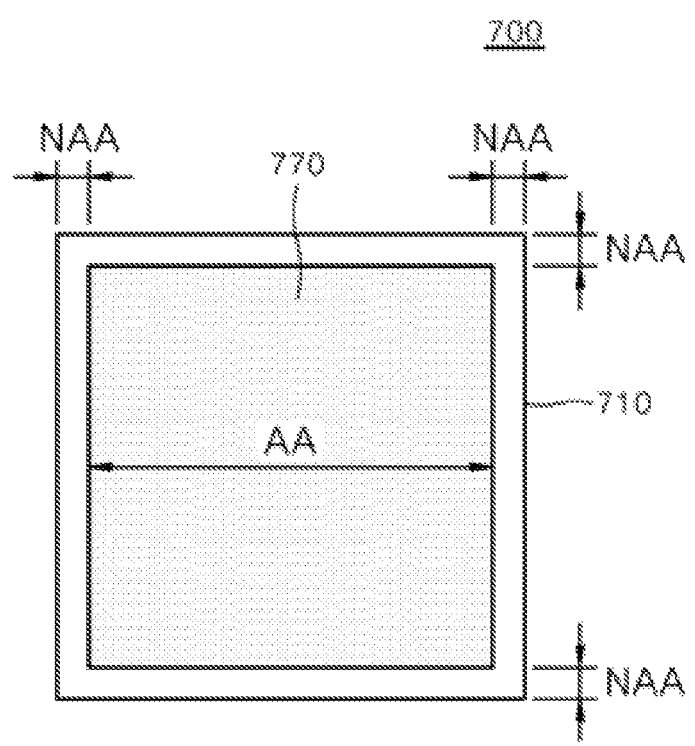
FIG. 11 is a plan view showing an OLED lighting device according to a seventh aspect.
Figure 12:
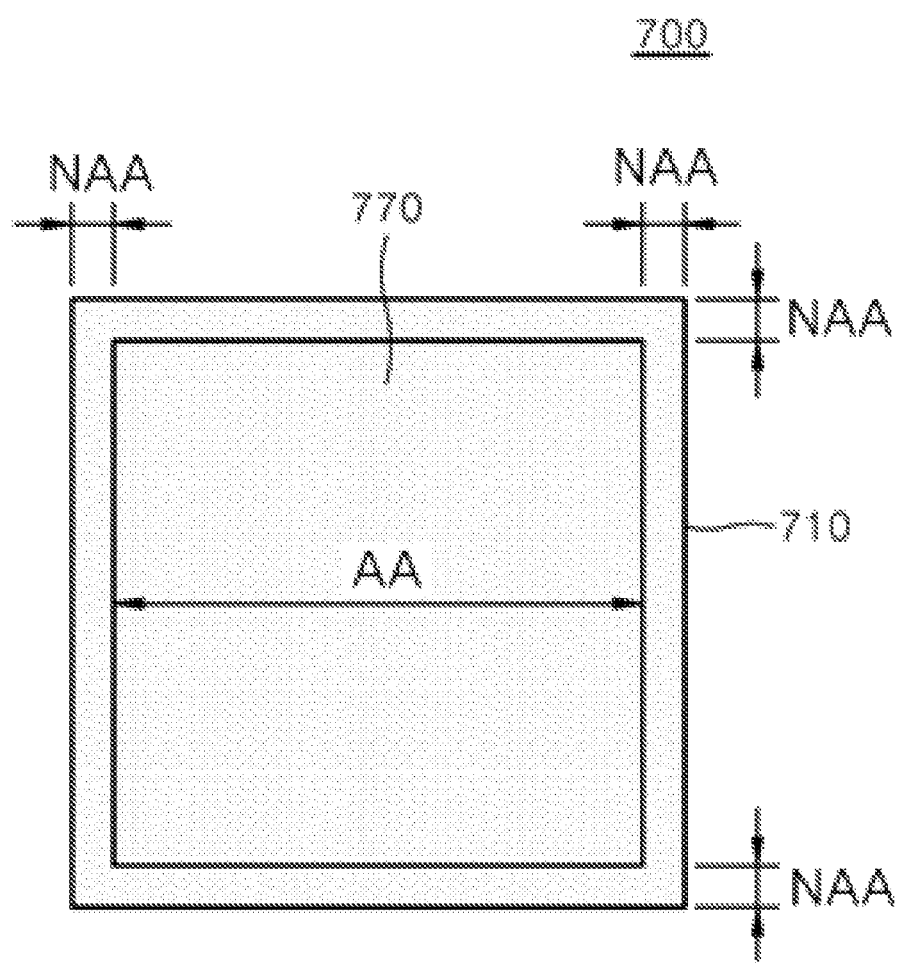
FIG. 12 is a plan view showing an OLED lighting device according to a modification of the seventh aspect of the present disclosure.

FIG. 11 is a plan view showing an OLED lighting device according to a seventh aspect. FIG. 12 is a plan view showing an OLED lighting device according to a modification of the seventh aspect of the present disclosure.

As shown in FIGS. 11 and 12, OLED lighting devices 700 according to the seventh aspect and the modification of the seventh aspect may be an OLED lighting device for an automobile lamp.

For this purpose, the OLED lighting device 700 according to the seventh aspect may include a substrate 710 mounted on front and rear surfaces of an automobile and a thermochromic pattern 770 arranged on the substrate 710. Here, the thermochromic pattern 770 may be substantially the same as the thermochromic pattern according to the third aspect described with reference to FIG. 4.

According to the seventh aspect, the thermochromic pattern 770 may be arranged to cover the entire active area AA of the substrate 710, or to cover both the entire active area AA and non-active area NAA of the substrate 710. The thermochromic pattern 770 arranged to cover the entire active area AA of the substrate 710 or the entire active area AA and non-active area NAA may be discolored by the heat generated when the automobile is running, thereby making it possible to emit light with a desired color.

For example, the thermochromic pattern 770 including a yellow thermochromic pigment arranged to cover the entire active area AA of the substrate 710 or the entire active area AA and inactive area NAA of the substrate 710 may become yellow by heat generated when the automobile is running, thereby making it possible to emit light with a yellow color.

The present disclosure is described with reference to aspects described herein and accompanying drawings, but is not limited thereto. It should be apparent to those skilled in the art that various changes or modifications which are not exemplified herein but are still within the spirit and scope of the present disclosure may be made.

What is claimed is:

1. An organic light emitting diode (OLED) lighting device, comprising:
    a substrate;
    an auxiliary wiring arranged on a first surface of the substrate;
    an OLED arranged on the auxiliary wiring including a first electrode connected to the auxiliary wiring, and an organic light emitting layer and a second electrode stacked on the first electrode; and
    a thermochromic pattern arranged on a second surface of the substrate.

2. The OLED lighting device of claim 1, wherein the thermochromic pattern on the second surface of the substrate is disposed at an active area.

3. The OLED lighting device of claim 1, wherein the thermochromic pattern on the second surface of the substrate is disposed at an active area and a non-active area.

4. The OLED lighting device of claim 3, wherein the thermochromic pattern is arranged to cover an entire non-active area.

5. The OLED lighting device of claim 1, wherein the thermochromic pattern includes a thermochromic pigment.

6. The OLED lighting device of claim 1, wherein the thermochromic pattern has a thickness in a range of 1 to 300 µm.

7. The OLED lighting device of claim 1, further comprising a barrier layer covering the thermochromic pattern and the second surface of the substrate and an encapsulation layer covering the OLED.

8. The OLED lighting device of claim 7, wherein the barrier layer includes at least one of polyethlene terephthalate (PET), polymethyl methacrylate (PMMA), polyethylene terephthalate (PEN), polyester (PE), polycarbonate (PC), and polyethersulfone (PES).

9. An OLED lighting device, comprising:
    a substrate;
    a buffer layer arranged on the substrate;
    an auxiliary wiring arranged on the buffer layer;
    an OLED arranged on the auxiliary wiring and including a first electrode connected to the auxiliary wiring, and an organic light emitting layer and a second electrode stacked on the first electrode; and
    a thermochromic pattern arranged inside the substrate.

10. The OLED lighting device of claim 9, wherein the thermochromic pattern is arranged between the substrate and the buffer layer.

11. The OLED lighting device of claim 9, wherein the thermochromic pattern is arranged between the buffer layer and the organic light emitting layer.

12. An organic light emitting diode (OLED) panel, comprising:
    a substrate having first and second surfaces facing each other;
    an auxiliary wiring disposed on the first surface;
    an OLED disposed on the auxiliary wiring and including a first electrode connected to the auxiliary wiring and an organic light emitting layer and a second electrode stacked on the first electrode;
    a thermochromic pattern disposed on the second surface;
    a barrier layer covering the thermochromic pattern and the second surface; and
    an encapsulation layer encapsulating the OLED.

13. The OLED lighting device of claim 12, wherein the thermochromic pattern is disposed at an active area of the OLED panel.

14. The OLED lighting device of claim 12, wherein the thermochromic pattern is disposed at an active area and a non-active area.

15. The OLED lighting device of claim 14, wherein the thermochromic pattern covers an entire surface of the non-active area.

16. The OLED lighting device of claim 12, wherein the thermochromic pattern includes a thermochromic pigment.

17. The OLED lighting device of claim 12, wherein the thermochromic pattern has a thickness in a range of 1 to 300 µm.

18. The OLED lighting device of claim 12, wherein the barrier layer includes at least one of polyethylene terephthalate (PET), polymethyl methacrylate (PMMA), polyethylene terephthalate (PEN), polyester (PE), polycarbonate (PC), and polyethersulfone (PES).

19. The OLED lighting device of claim 12, further comprising a buffer layer on the substrate.

20. The OLED lighting device of claim 12, wherein the thermochromic pattern includes a photosensitive material.

* * * * *